United States Patent [19]

Iwamatsu

[11] Patent Number: 5,327,011
[45] Date of Patent: Jul. 5, 1994

[54] SEMICONDUCTOR DEVICE WITH ENHANCED VIA OR CONTACT HOLE CONNECTION BETWEEN AN INTERCONNECT LAYER AND A CONNECTING REGION

[75] Inventor: Seiichi Iwamatsu, Suwa, Japan
[73] Assignee: Seiko Epson Corporation, Tokyo, Japan
[21] Appl. No.: 918,295
[22] Filed: Jul. 22, 1992

[30] Foreign Application Priority Data

Jul. 23, 1991 [JP] Japan .................................. 3-182132
May 13, 1992 [JP] Japan .................................. 4-120209

[51] Int. Cl.$^5$ ...................... H01L 23/48; H01L 29/46
[52] U.S. Cl. .................... 257/750; 257/753; 257/758; 257/773; 257/774
[58] Field of Search ............... 257/750, 752, 753, 758, 257/773, 774

[56] References Cited

U.S. PATENT DOCUMENTS 5,110,762  5/1992  Nakahara et al. .................. 257/758
5,117,276  5/1992  Thomas et al. ..................... 257/773
5,243,220  9/1993  Shibata et al. ..................... 257/750

OTHER PUBLICATIONS

Carter Kaanta et al., "Submicron Wiring Technology With Tungsten and Planarization", IEEE International Device Electron Meeting (IDEM), pp. 87-209 to 87-212, 1987.

Primary Examiner—Mark V. Prenty
Attorney, Agent, or Firm—W. Douglas Carothers, Jr.

[57] ABSTRACT

A semiconductor device has an interconnect layer, connected to a connecting region, such as a diffusion region or layer formed on the surface of a substrate, through a contact hole formed in an interlayer insulating film, which includes a concavity, representing a defective portion, extending from the bottom portion of the contact hole to the surface of the interconnect layer. This defective portion occurs because the metal comprising the interconnect layer will not penetrate to completely fill the contact hole. To correct for this formed defective portion, the concavity, the concavity is permitted to be formed followed by its filling with a plug electrode comprising a high quality penetration metal film, such as, tungsten. As a result, the mechanical as well as electrical characteristics of the interconnect layer connection to the connecting region is significantly improve by the presence of the plug electrode. In an alternative approach, both the interlayer insulating film and the interconnect layer comprising, for example, aluminum layer, may first be formed on the surface of the substrate followed by the selective etching to form concavities or contact holes within which are formed plug electrodes comprising, for example, a tungsten film for electrically connecting the interconnect layer to the diffusion layer through the plug electrode per se.

8 Claims, 8 Drawing Sheets

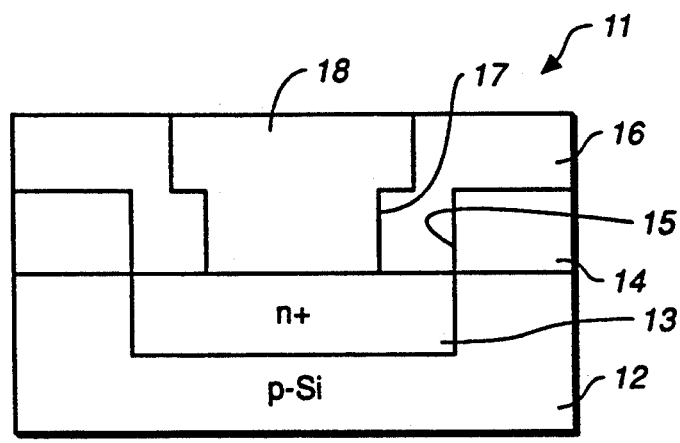
FIG._1
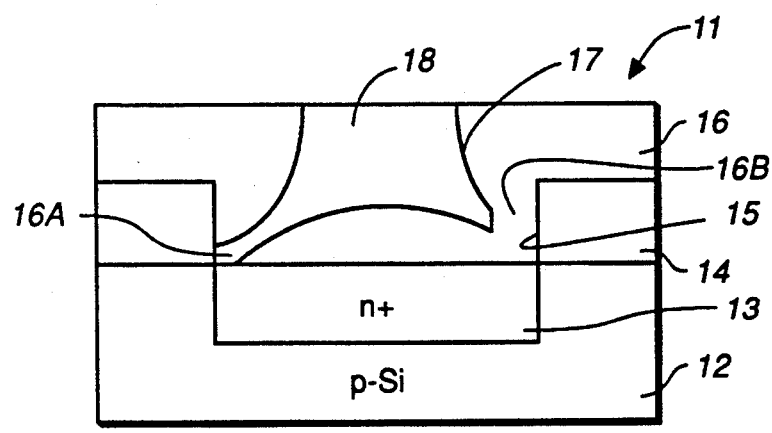
FIG._2
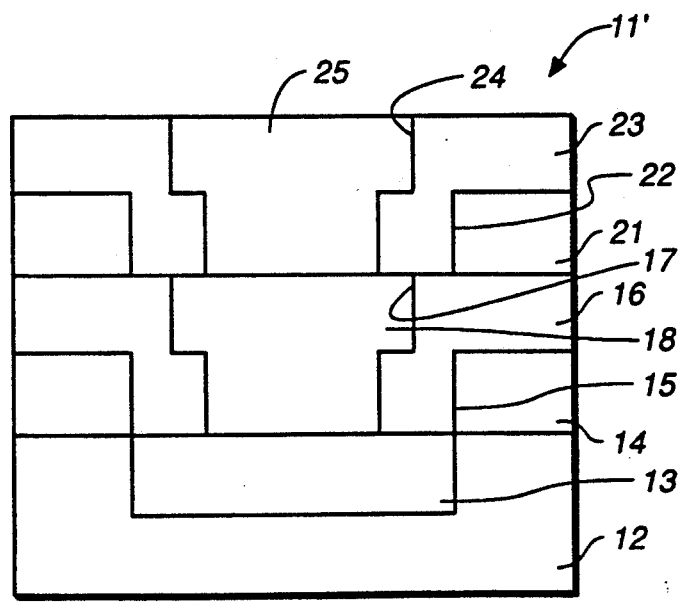
FIG._3

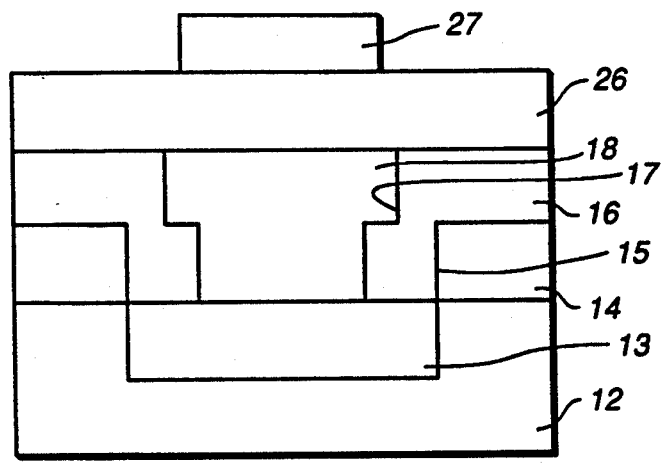
FIG._4A
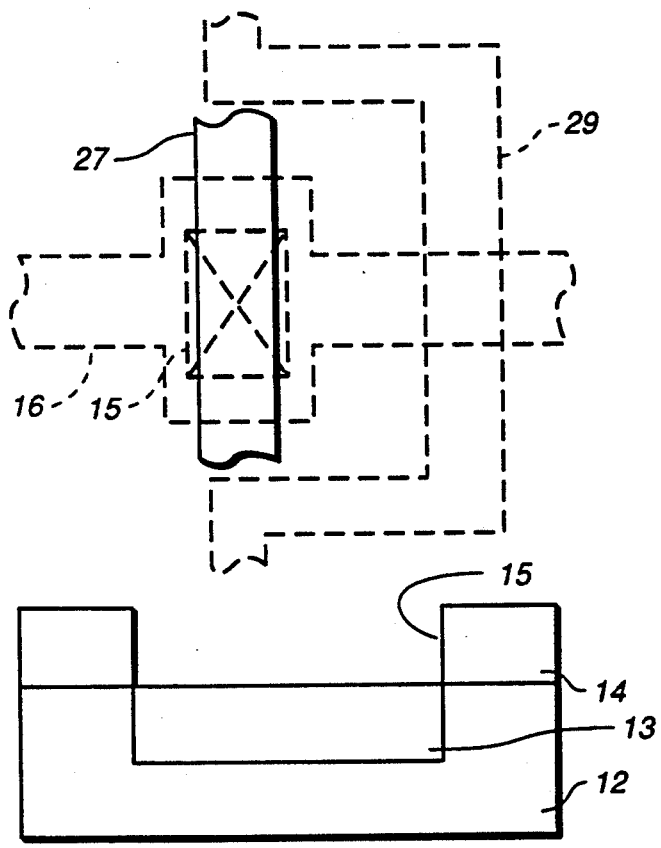
FIG._4B
FIG._5A
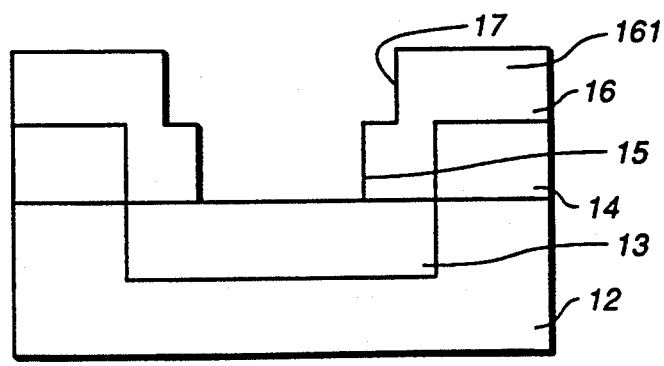
FIG._5B

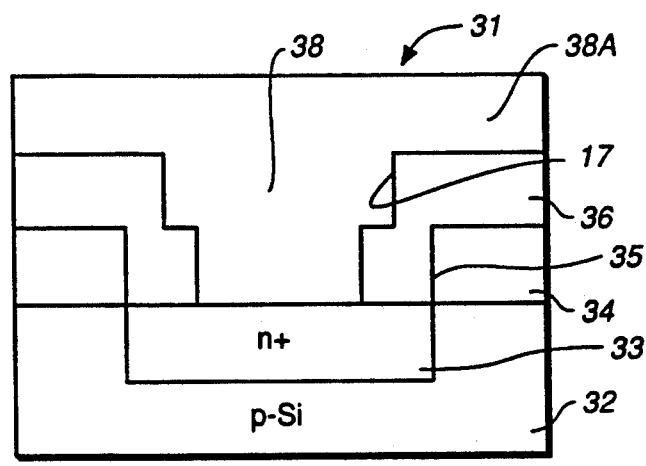
FIG._6
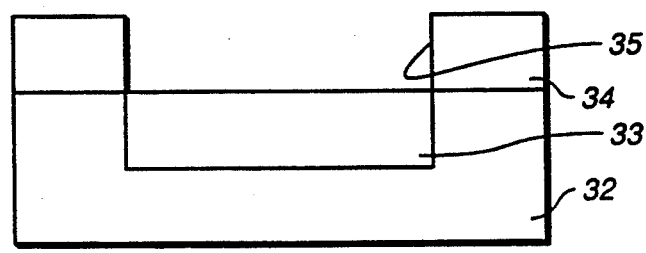
FIG._7A
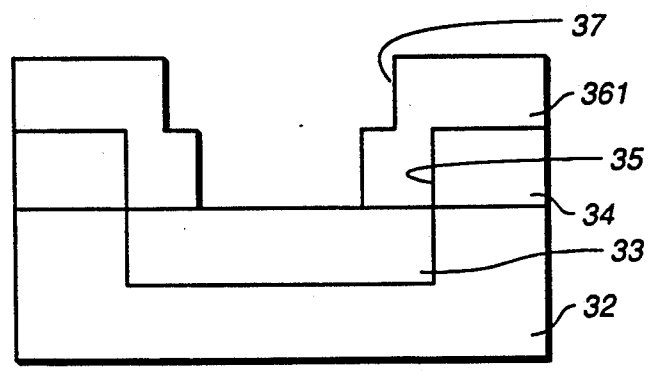
FIG._7B
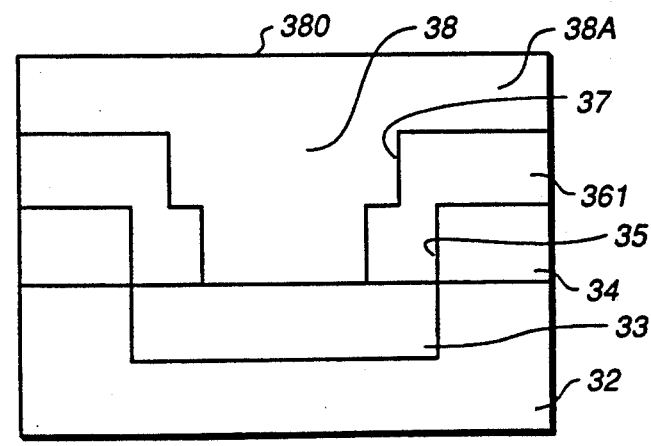
FIG._7C

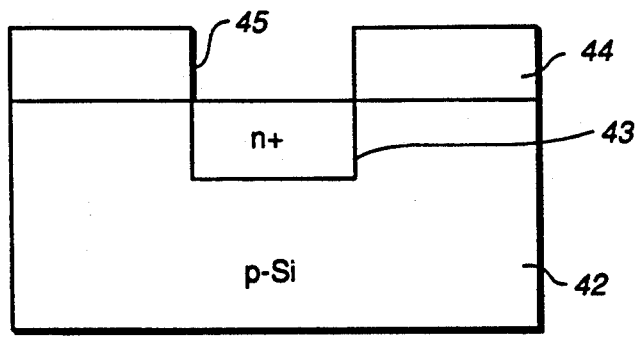
FIG._8A
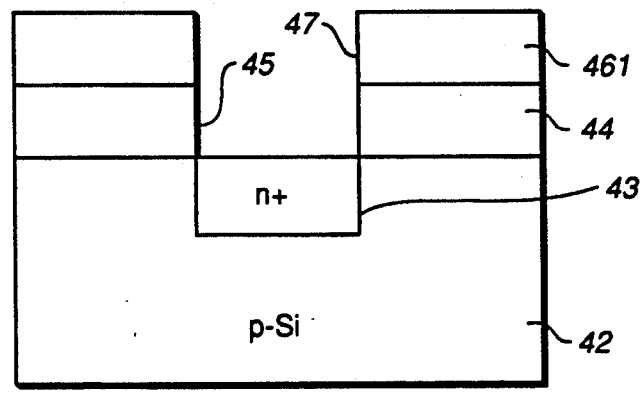
FIG._8B
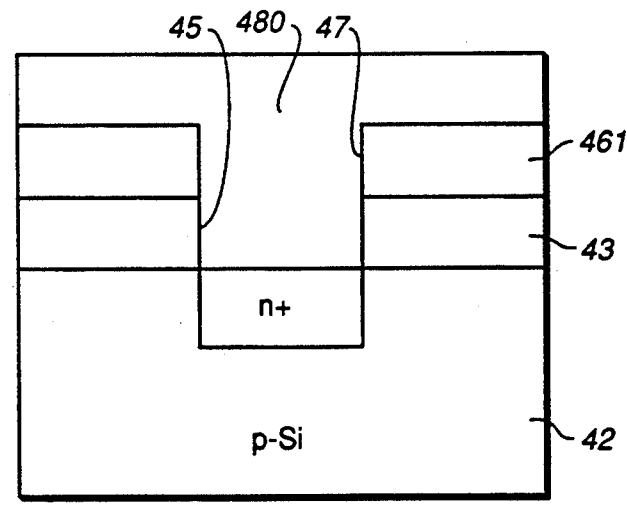
FIG._8C
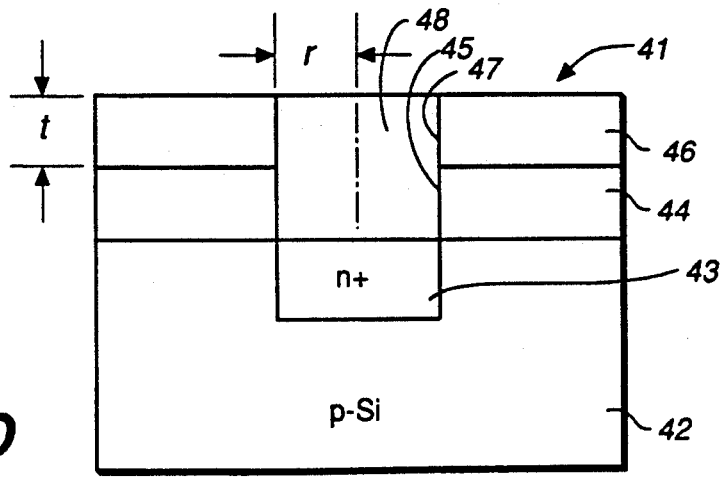
FIG._8D

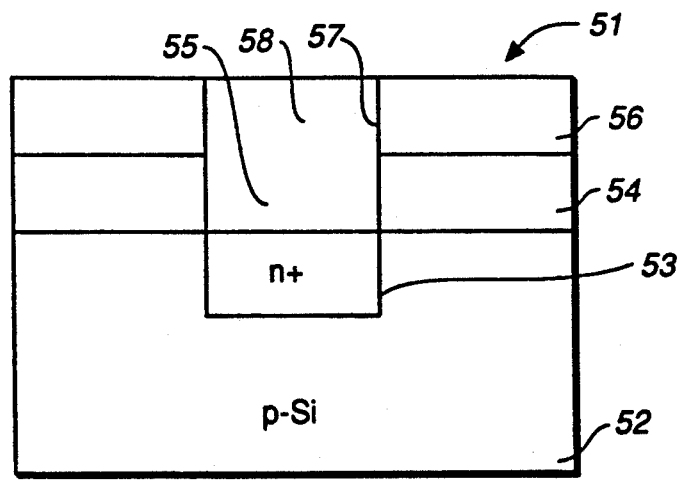
FIG._9
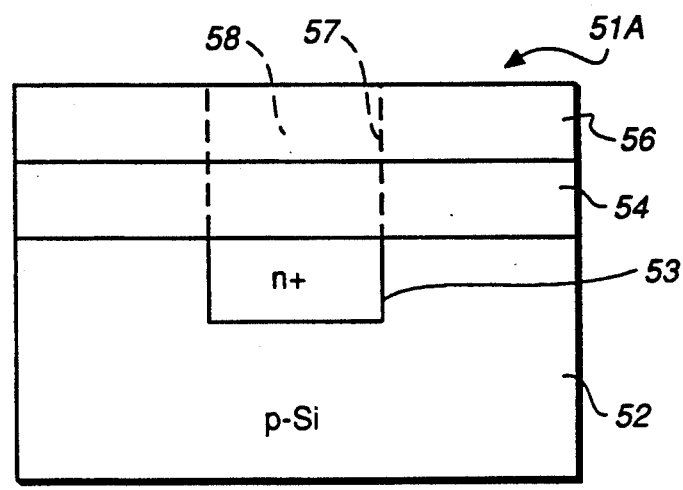
FIG._10
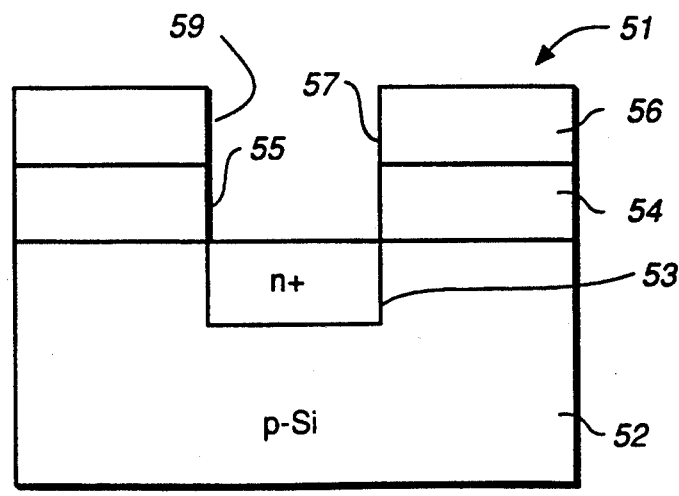
FIG._11A

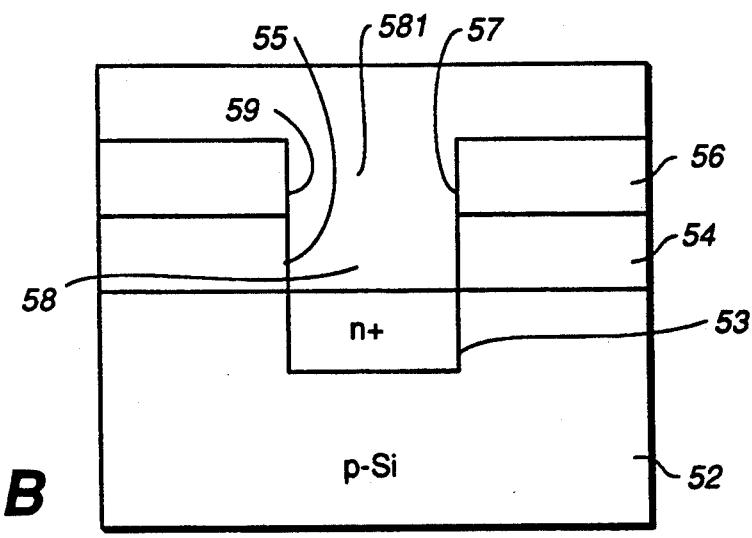
FIG._11B
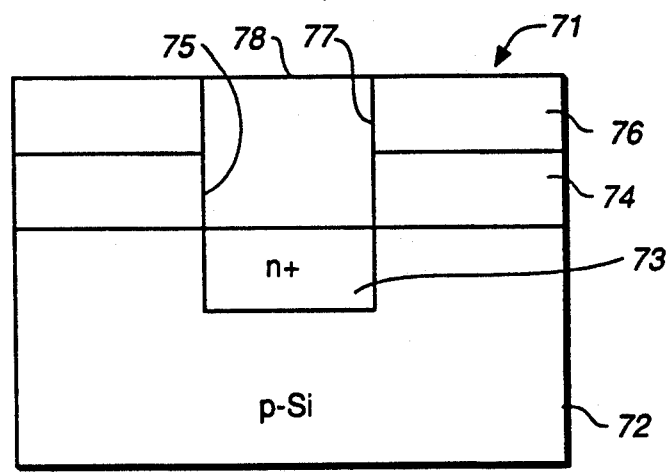
FIG._12
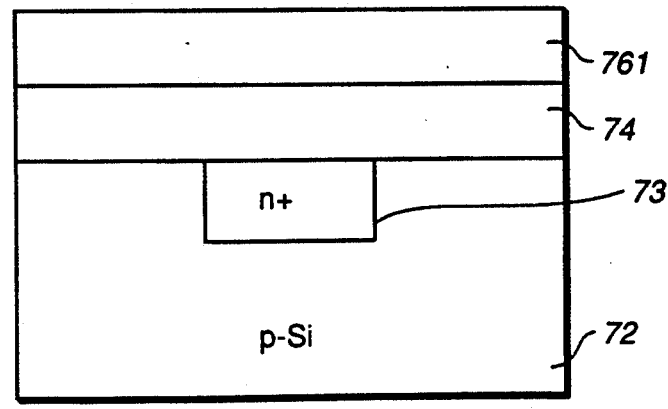
FIG._13A

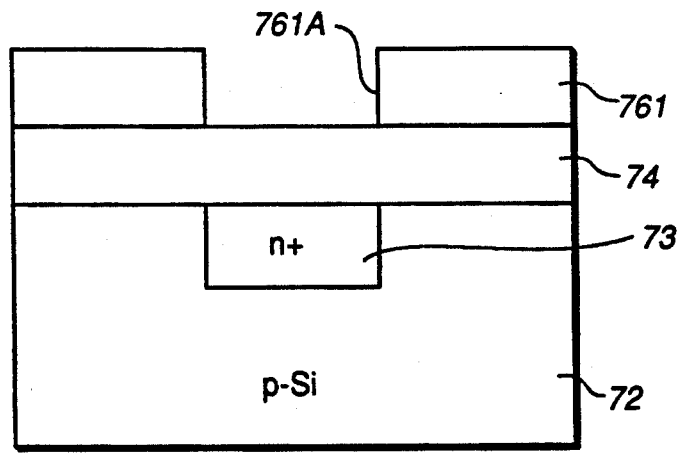
FIG._13B
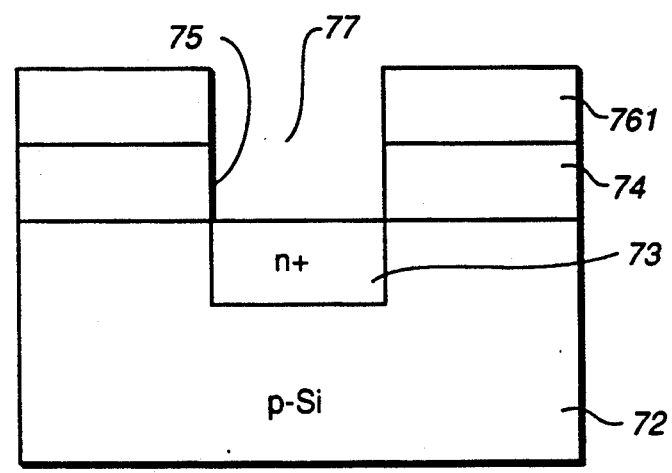
FIG._13C
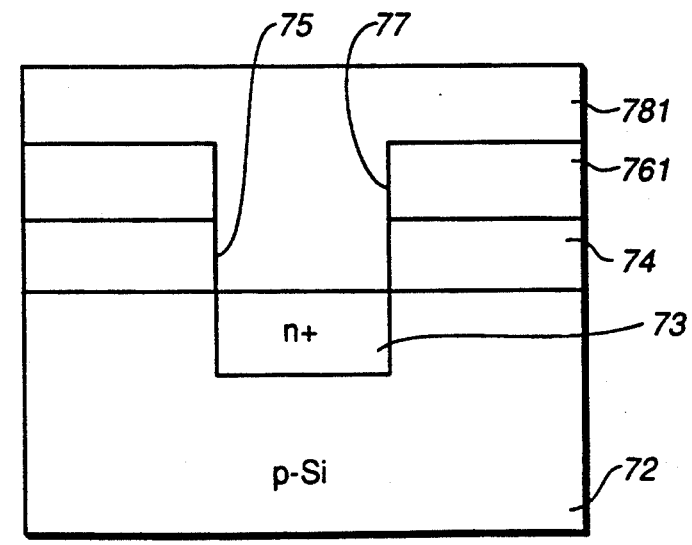
FIG._13D

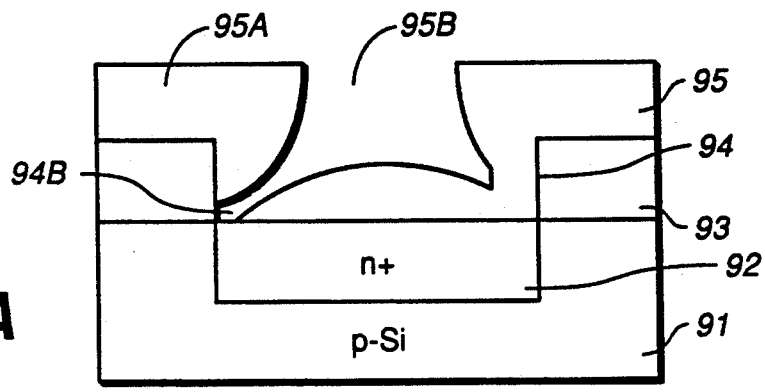
FIG._14A
(PRIOR ART)
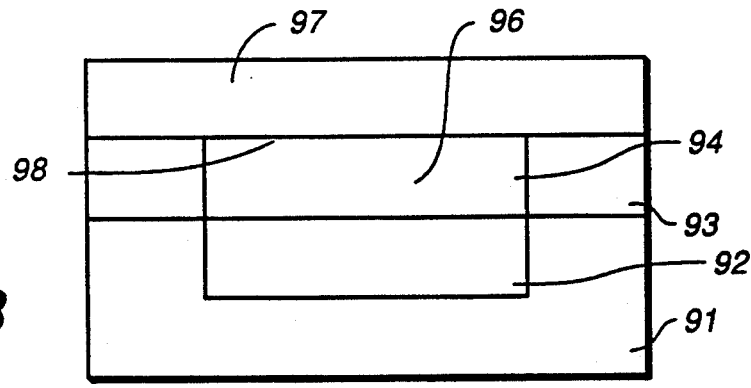
FIG._14B
(PRIOR ART)

SEMICONDUCTOR DEVICE WITH ENHANCED VIA OR CONTACT HOLE CONNECTION BETWEEN AN INTERCONNECT LAYER AND A CONNECTING REGION

BACKGROUND OF THE INVENTION

This invention relates generally to wiring structures for semiconductor devices, and more particularly to wiring structures connected to other connecting regions of the semiconductor devices through a contact hole of an interlayer insulating film employing a plug electrode to thereby electrically connect the semiconductor device connecting regions and the interconnect layer employing miniaturizing patterns of interconnect layers.

In a conventional wiring structure for a semiconductor device in the case where a via or a contact hole is formed in an interlayer insulating film, the interconnect layer is connected to a connecting region representing a lower interconnect layer or a diffusion layer formed in the surface of a semiconductor substrate or a multilayer interconnection. The acquired mechanical electrical characteristics and the resultant reliability of semiconductor device depends on the condition or state of the interconnect layer formed within the contact hole.

Reference is made to FIG. 14A illustrating a typical interconnect layer condition occurring relative to a contact hole. In FIG. 14A, a substrate 91, such as, p-type silicon, includes a deposited interlayer insulating film 93 on substrate 91 with a formed contact hole 94 through which diffusion layer 92, such as, with an n-type dopant, has been formed in the surface of substrate 91, which is followed by the formation of interconnect layer 95 comprising, for example, aluminum. The aluminum interconnect layer 95 is formed by means of deposition on the substrate 91, contact of layer 95 is made directly to diffusion layer 92. However, the deposit of the metal is not fully uniform and complete in contact hole 94, in that, for example, the metal does not deposit on the bottom corner of contact hole 94, as indicated at 94B, and forms a defective concavity or portion 95B in the form of an irregularly shaped aperture with the remaining portion of interconnect layer 95 forming an aperture verge 94A of contact hole 94. With this condition present, the contact resistance between interconnect layer 95 and diffusion layer 92 as well as the wiring resistance of interconnect layer 95 within contact hole 94 is high.

Furthermore, the disconnection of interconnect layer 95 from with contact hole 94 can easily occur. Also, in case where a multilayer interconnect is formed on the surface of substrate 91, the configuration of concavity 95B is in relief, i.e., a multitude of raised surfaces, in the upper portion of contact hole 94 so that a stepped difference or multiple stepped difference tends to occur on the upper portion of interconnect layer 95.

To correct for this situation, conventionally the internal portion of a contact hole 94 is initially filled with a plug electrode 96, as illustrated in FIG. 14B. Plug electrode 96 may be comprised of a tungsten film having good penetration quality. The use of such a single metal plug electrode of tungsten is know in the art, as set forth in the article to Carter Kaanta et al., "Submicron Wiring Technology With Tungsten and Planarization", *International Device Electron Meeting*, 1987, pp. 209-212. Next, interconnect layer 97, such as, aluminum, is formed on the surface of plug electrode 96. However, with the miniaturization of the pattern comprising interconnect layer 97 due to a reduce scale of circuit integration, the size of contact hole 94 becomes corresponding smaller resulting in an increase in contact resistance. Further, because only the upper surface of plug electrode 96 is connected to interconnect layer 97 at 98, the result contact area is smaller between plug electrode 96 and interconnect layer 97. The loss of contact area in this case is more accentuated when the size of contact hole becomes smaller due to a reduction of the scale of integration into the submicron range.

In addition, the process of forming interconnect layer 97 may consistently result in poor penetration relative to electrode 96 so that if a defective portion, such as, a poor contact region with electrode 96, is produced in interconnect layer 97, and there is no developed subsequent processing technique for restructure or restoring such a defective portion. As a result, a defective and nonusable integrated circuit structure is produced.

An object of this invention is to provide a method and structure for reliable mechanical and electrical connection between an interconnect layer and a connecting region such as, a diffusion layer, in a semiconductor device of an integrated circuit, even where the integration scale of the interconnect layer pattern and the integrated circuit is reduced to the sub-micron range.

SUMMARY OF THE INVENTION

According to this invention, a semiconductor device includes a metal interconnect layer connected to a connecting region, such as, a diffusion region formed on the surface of a semiconductor substrate, through a formed contact hole or via through an interlayer insulating film formed on the surface of the substrate, and the concavity remaining in the contact hole after forming the interconnect layer, which extends from the bottom of the contact hole to the surface of the interconnect layer is filled with plug electrode comprising a material having a high penetration quality. In particular, rather than initially use the penetration quality material as the interconnect layer, the interconnect layer of conventional metal, such as aluminum, is initially formed, knowingly forming defective portions in the form of a concavity in the contact holes to the connecting region. The concavity is thereafter itself filled with a material having a high penetration quality resulting in an integrated plug electrode structure that results in good electrical properties between the interconnect layer and the connecting region.

The concavity produced by the formation of the interconnect layer is treated as a defective portion within the contact hole and results because the metal employed for the interconnect layer generally does not have good penetration quality particularly as the size of the contact hole becomes smaller due to reduce scale integration. The invention disclosed provides a process of forming an interlayer insulating film on the surface of a substrate that also includes a connecting region, such as, a diffusion region formed in the substrate to which a contact hole has to be formed for providing good mechanical and electrical connection between an overlying interconnect layer and the connecting region. A contact hole is formed through the interlayer insulating film to the surface of the connecting region exposing the connecting region surface. This is followed by forming a conductive film, to be employed as an interconnect layer, on the surface of the interlayer insulating film, which also provides a conductive via to the exposed connecting region at the bottom of the contract hole. Alternatively, the present invention provides for forming the contact hole only to the surface of the interlayer insulating film and a conductive via is provide to the bottom of the contact hole at the surface of the interlayer insulating film. As a result, due to the scale or smallness of the contact hole, a concavity remains in the formed metal of the interconnect layer within the contact hole, which may extend from the bottom of the contact hole to the surface of the interconnect layer, and which is detrimental to good electrical characteristics in that a good electrical connection does not result with the connecting region, the via resistance is high and there is high contact resistance with the connecting region. The present invention solves this problem by forming a plug electrode within the concavity comprising a material having a high penetration quality that fills entirely the concavity, such as, tungsten film, titanium nitride film, polysilicon film, a plated nickel film or a tin or pewter film. A metal or an alloy for the plug electrode may be selected from tin or pewter which have a lower melting point compared with that of interconnect layer material, such as, aluminum so that a conductive film employed as the plug electrode be formed by using a low melting metal or alloy.

As an alternative approach, rather than form the contact hole before the formation of the interconnect layer, the contact hole is formed after the formation of the interconnect layer. The contact hole is then formed so that the concavity exists after the interconnect film has been formed and is thereafter filed with a plug electrode employing a conductive film having high penetration quality that fills the concavity from the bottom of the contact hole to the surface of the conductive film employed as interconnect layer forming a conductive plug electrode. In forming the contact hole, photoresist may be used to form a contact hole in the interconnect layer followed by etching of the interlayer insulating film employing the interconnect layer as masking layer. In this manner, a contact hole is self-aligned relative to the exposed portion of the conductive film employed as an interconnect layer and the masking for the formation of the initial contact holes in this conductive film may have the same pattern as that employed for originally forming the connecting regions. In the step of forming the exposed portion of the conductive film to provide the initial contact holes in this film can be accomplished by photo etching as well as general solvent etching.

The film formed plug electrode in the contact hole may be made to extend outside of the filled concavity and over the surface of the conductive film comprising the interconnect layer. Then, the surface of the film is then etch backed to the surface of the plug electrode and the interconnect layer.

Relative to another aspect of this invention, the plug electrode film may be extended to cover the interconnect layer and this added metal film cover is utilized as a redundant interconnect layer in combination with interconnect layer forming a stronger, integrated interconnect structure.

In the present invention, it is preferred that the thickness of the interconnect layer is equal to or greater than about ¼ of the inner width of the contact hole. According to such set value, a larger contact area is achieved with the plug electrode particularly as the size or width of the contact hole is decreased. In such a case, the side surface contact becomes crucial in effectively achieving smaller orders of sub-micron integration having high yield and reliable metal via's or contact holes.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a cross sectional view of a semiconductor device according to a first embodiment of this invention.

FIG. 2 is a cross sectional view of semiconductor device according to a first embodiment of this present invention illustrating the condition or state of an interconnect layer inside of a contact hole of the device.

FIG. 3 is a cross sectional view of a multilayer interconnection structure relative to a semiconductor device according to the first embodiment of this invention.

FIG. 4A is a cross sectional view of another multilayer interconnection structure relative to a semiconductor device according to the first embodiment of this invention.

FIG. 4B is a plan view of the structure shown in FIG. 4A.

FIGS. 5A and 5B illustrate successive steps of the manufacturing process relative to the semiconductor device according to the first embodiment of this invention.

FIG. 6 is a cross sectional view of a semiconductor device according to a second embodiment of this invention.

FIGS. 7A–7C illustrate successive steps of the manufacturing process relative to the semiconductor device according to the second embodiment of this invention.

FIGS. 8A–8D illustrate successive steps of the manufacturing process relative to the semiconductor device according to the third embodiment of this invention.

FIG. 9 is a cross sectional view of a semiconductor device according to a fourth embodiment of this invention.

FIG. 10 is a cross sectional view of a gate array and ROM subassembly utilizing a semiconductor device according to the fourth embodiment of this invention.

FIGS. 11A and 11B illustrate successive steps of the manufacturing process relative to the semiconductor device according to a fifth embodiment of this invention.

FIG. 12 is a cross sectional view of semiconductor device according to the fifth embodiment of this invention.

FIGS. 13A–13D illustrate successive steps of the manufacturing process relative to the semiconductor device according to the fifth embodiment of this invention.

FIG. 14A is a cross sectional view of a semiconductor device for purposes of illustrating problems incurred in conjunction with interconnect layers employed in such devices.

FIG. 14B is a cross sectional view of another semiconductor device for purposes of illustrating problems incurred in conjunction with interconnect layers employed in such devices.

DESCRIPTION OF THE PREFERRED EMBODIMENTS

EMBODIMENT 1

Reference is now made to FIGS. 1-5 relative to a first embodiment of this invention. As shown in FIG. 1, semiconductor device 11 comprises diffusion layer 13, for example, of n+ type dopant, is formed in substrate 12 of p-type silicon via contact hole 15 formed in interlayer insulating layer 14. As used herein, diffusion layer 13 is representative of one of many types of connecting regions requiring electrical connection to an interconnect or interconnect layer. Diffusion layer 13 may have a depth of about 0.1 μm and is formed on the surface of substrate 12. Interlayer insulating film 14 may comprise a silicon oxide film having thickness in the range of 0.3 μm to 0.5 μm and is formed on the surface of diffusion layer 13 and substrate 12, after which contact hole 15 having a diameter of about 0.5 μm is formed in interlayer insulating film 14 in correspondence with the region of formed diffusion layer 13. Thereafter, interconnect layer 16 comprising an aluminum layer or film having a thickness of about 0.5 μm is formed on the surface of interlayer insulating film 15. Although interconnect layer 16 is connected to diffusion layer 13 at the bottom of contact hole 15, owing to the irregular dispersion condition or state of aluminum penetration relative to the internal surface of contact hole 15, a portion of interconnect layer 16 is not formed in contact on or engagement with the surface of diffusion layer 13. As a result, a concavity 17 is formed extending from the bottom of contact hole 15 to the surface of interconnect layer 16 and, further, forming defective portions in interconnect layer 16 within contact hole 15, such as, indicated in FIG. 2 at 16A and 16B. The defective portion is produced owing to the manner of penetration when forming the aluminum layer. Defective portion 16A results in a insulating condition formed between interconnect layer 16 and diffusion layer 13. Defective portion 16B is connected to diffusion layer 13 in unstable manner because of thinness of the aluminum layer itself in this region.

In order to reduce the scale of the wiring pattern of the semiconductor device and the integrated circuit, the dimensional width of the contact hole will correspondingly become smaller. In particular, when the aspect ratio of contact hole 15 becomes greater than about 0.3, the formation of concavity 17 occurs. As a result, the presence of concavity 17 causes the disconnection of interconnect layer 16 from within contact hole 15 and/or the disconnection along the aperture verge of contact hole 15.

Concavity 17 is filled with a plug electrode 18 comprising, for example, tungsten, which is selectively formed within concavity 17 by employing selective CVD. Beside employing tungsten, a titanium nitride film or a polysilicon film may also be employed as plug electrode 18. As a result, interconnect layer 16 is connected directly, in part, to the surface of diffusion layer 13 as well as through plug electrode 18. Semiconductor device 11, therefore, comprises plug electrode 18 and interconnect layer 16, and the surface of device 11 may be uniform in flatness. Beside the tungsten film being formed by employing selective CVD, an alternative method the formation of a thin nickel film on the bottom surface of contact hole 15 by means of plating followed by the selective deposition of a pewter layer within concavity 17. By employing either one of these methods, plug electrode 18 will be formed uniformly on the bottom of contact hole 15 along the defined configuration of concavity 17 and entirely fill the capacity of concavity 17. Also, a conductive film having a thickness greater than twice the depth of concavity 17 is formed not only inside but also outside of concavity 17, i.e., on the surface of the aluminum film, forming interconnect layer 16. The conductive film forming this surface layer may be, for example, a tungsten formed film, a nickel plated film or a deposited metal film having a thickness of about 1.0 μm. After the formation of the top region of interconnect layer 16, any unnecessary portion of layer 16, outside of the contact hole 15, may be removed by means of etchback, leaving plug electrode 18 as contained within concavity 17.

The structure of semiconductor device 11 is reinforced by the presence of the tungsten plug electrode 18 within concavity 17. Moreover, tungsten filled concavity 17 results in good contact coverage on inner surfaces of concavity 17 with no resultant defective portion remaining within the confines of the concavity. Therefore, even in the case of reduction in scale including the reduction in size of contact hole 15, there is no possibility of causing a disconnection within or along the aperture verge of contact hole 15. Therefore, the reliability of forming semiconductor devices utilizing contact holes and corresponding interconnect layers of the type described here is dramatically increased. In addition, there is a decrease in contact resistance relative to diffusion layer 13 as well as the wiring resistance within contact hole 15.

Furthermore, since plug electrode 18 is connected to interconnect layer 16 through its own surface face, a larger contact area is achieved with interconnect layer 16, even if the dimensional width of contact hole 15, and correspondingly, the dimensional width of concavity 17, are decreased in integrated circuit scale.

The result of this invention is that concavity 17 is filled entirely with the plug electrode material, and the surface of semiconductor device 11, comprising plug electrode 18 and interconnect layer 16, is rendered substantially flat. Therefore, it is possible to provide with high reliability a multilayered interconnect structure, as illustrated in FIG. 3. Semiconductor device 11' comprises a two layered interconnect structure including, in addition to the structure shown in FIG. 1, second interlayer insulating film 21 formed on the surface of interconnect layer 16 with interconnect layer 23 connected to the surface of interconnect layer 16 via contact hole 21 and with plug electrode 25 formed via contact hole 22 in interlayer insulating film 21 in concavity 24 formed in layer 23. Contact hole 22 is formed in alignment with contact hole 15. Concavity 24, as the defective portion of interconnect layer 23, is filled with a plug electrode 25 comprising a tungsten film.

As indicated in FIGS. 4A and FIG. 4B, even if a final interconnect layer 27, positioned on the surface of interlayer insulating film 26 of the upper interconnect structure is formed on the surface side of interconnect layer 26 so as to pass over the position of contact hole 15 of the lower interconnect structure, there is no possibility of forming interconnect 27 with discontinuities because of step differences in the region of the multilayer interconnect since such step differences will not occur. Therefore, it is possible to form with high reliability a multilayer interconnect structure with interconnects formed directly on the multilayer interconnect structure rather than skirting around the multilayer interconnect structure, such as, by-pass interconnect 29 shown in dotted outline in FIG. 4B. The structural design of this invention provides for an enhanced degree of freedom in wiring layout having improved high density.

Reference is now made to the manufacturing method relative to forming semiconductor device 11 with plug electrode 18 with references to FIGS. 5A and 5B.

First, an interconnecting region in the form of a diffusion layer 13 is formed on substrate 12 having a depth of about 0.1 μm. Next, interlayer insulating film 14, comprising a silicon oxide film having thickness in the range of 0.3 μm~0.5 μm, is formed on the surface of substrate 12. Then, contact hole 15 is formed in interlayer insulating film 14 exposing the surface of diffusion layer 13. The diameter of contact hole may be, for example, about 0.5 μm and correspond in diameter to the region of diffusion layer 13.

As illustrated in FIG. 5B, aluminum layer 161, having a thickness of about 0.5 μm, is deposited on the surface side of substrate 12 and insulating layer 14. Although aluminum layer 161 is formed within contact hole 15, there are some portions of the layer that do not engage within the confines of contact hole 15 so that aluminum layer 161 is not completely fill contact hole 15, producing a void or concavity 17 extending from the surface of substrate 12 at the bottom of hole 15 to the surface of aluminum layer 161. Aluminum layer 161 is patterned by employing a mask layer to form interconnect layer 16.

In order to form plug electrode 18 within concavity 17, a tungsten film is formed on the surface of substrate 12 and within contact hole 15 by employing selective CVD using a gas mixture comprising SIH$_4$ and WF$_6$. As a result, interconnect layer 16 is directly connected to the surface of diffusion layer 13, in part, through plug electrode 18 as well as interconnect layer 16. The conductive film comprising tungsten film may have a thickness of about 1.0 μm and is formed within concavity 17 as well as on the outside thereof, i.e., on the surface of formed interconnect layer 16. This conductive film has a thickness in proportion to the depth of concavity 17.

After this step, unnecessary portions of plug electrode 18 formed outside of the confines of concavity 17 are removed by a simple etchback process, and with only that portion of plug electrode 18 within concavity 17 remaining. Instead of a tungsten film, a plated nickel layer or a deposited metal film of about 1.0 μm thickness may be employed. In addition, after forming the thin nickel layer on the bottom surface of contact hole 15 by means of plating, the inside of concavity 17 is filled by means of selective plating of tin or pewter.

As indicated above, in this embodiment, a process of forming interconnect layer 16 comprising aluminum is initially performed recognizing that it will be formed with poor penetration leaving a void or defective portion in the form of concavity 17, which concavity can be restored employing a tungsten film which exhibits excellent penetration quality filling in a complete manner concavity 17. As a result, the defective portion of interconnect layer 16 in semiconductor device 11 can be repaired or restored resulting in higher yield of fabricated integrated circuits employing semiconductor devices 11.

Embodiment 2

Reference is now made to FIG. 6 illustrating a second embodiment of this invention. Semiconductor device 31 is substantially similar to the first embodiment shown in FIG. 1 so that a detailed explanation of the same components as shown in FIG. 1 is not necessary.

Diffusion layer 33 in substrate 32 may have a depth of about 0.1 μm and comprises a connecting region formed on the surface of substrate 32 for connection with interconnect layer 36 of semiconductor device 31. Interlayer insulating film 34 is deposited on the surface of substrate 32 and diffusion layer 33 and may be comprised of a silicon oxide film having a thickness of about 1.0 μm. Contact hole 35 is formed in interlayer insulating film 34 in corresponding alignment with diffusion layer 33 and may have a diameter of about 0.5 μm corresponding to the same diameter as the region forming diffusion layer 33. This is followed by the formation of aluminum interconnect layer 36 on insulating layer 34 and having a thickness of about 1.0 μm. Interconnect layer 36 is connected to diffusion region 33 through the bottom of contact hole 35. As explained in connection with FIG. 2 in the first embodiment, a concavity 37 is formed during the formation of layer 36 on the surface of substrate 32 and concavity 37 extends from the bottom of contact hole 35 to the surface of interconnect layer 36. Concavity 37 represents a defective portion of interconnect layer 36 within contact hole 35 causing an increase in wiring resistance or contact resistance between interconnect layer 36 and diffusion region 33. As in the case of the previous embodiment, concavity 37 is filled with a plug electrode 38 comprising a tungsten film. Plug electrode 38 expands from within concavity 37 to the surface of interconnect layer 36 molded with the same surface pattern as concavity 37 and expands upwardly and out of concavity 37. Expanded portion 38A forms what might be referred to as a redundant interconnect layer on the surface of interconnect layer 36. Instead of a tungsten film forming plug electrode 38, a titanium nitride film or polysilicon film may be also employed as a plug electrode.

Relative to the foregoing structure, interconnect layer 36 is reinforced by the tungsten plug electrode 38 filling concavity 37. Further, concavity 37 is completely filled with the tungsten plug providing excellent coverage of the confines of concavity 37 with no remaining void internally of the previously formed concavity. This results in the achievement of low contact resistance with respect to diffusion layer 33 and low wiring resistance within the confines of contact hole 35. Moreover, even if the inner width of contact hole 35 is made smaller due to reduced integrated circuit scale toward the lower extent of the submicron range, no interconnect void or interconnect disconnection results in interconnect layer 36 thereby increasing the reliability and electrical functionality of semiconductor device 31. Furthermore, plug electrode 38 is expanded from within concavity 37 to the surface of interconnect layer 36 congruent with the same pattern as the latter layer forming an expanded portion 38A functioning as a redundant interconnect layer with interconnect layer 36 thereby further enhancing the reliability and electric characteristics of interconnect layer 36. Plug electrode 38 buried within concavity 37 is in continuous facial contact with interconnect layer 36 so that even in the case where the size of contact hole 35 is reduced due to smaller scale integration, good contact area is maintained between plug electrode 38 and interconnect layer 36 with a decrease in contact resistance therebetween.

Reference is now made to the manufacturing method relative to forming semiconductor device 31 with plug electrode 38 with reference to FIGS. 7A-7C.

First, as shown in FIG. 7A, an interconnecting region in the form of a diffusion layer 33 is formed on substrate 32 having a depth of about 0.1 μm. Next, interlayer insulating film 34, comprising a silicon oxide film having thickness in the range of 0.1 μm is formed on the surface of substrate 32. Then, contact hole 35 is formed in interlayer insulating film 34 in order to expose the surface of diffusion layer 33. The diameter of contact hole 35 may be about 0.5 μm and correspond in diameter to the region of diffusion layer 33.

As illustrated in FIG. 7B, aluminum layer 361, having a thickness of about 1.0 μm, is deposited on the surface side of substrate 32 and insulating layer 34. Aluminum layer 361 will not uniformly and completely fill contact hole 35 resulting in the formation of concavity 37 in layer 361 which extends from the bottom of contact hole 35 to the surface region of aluminum layer 361.

Next, as shown in FIG. 7C, a thick tungsten conductive film 380 is formed by employ selective CVD filling the content of concavity 37. Film 380 not only fills the confines of concavity 37 but is also formed on the surface of aluminum layer 361. Following this step, a mask layer having a mask pattern is formed on the surface of tungsten film 380 to pattern tungsten film 380 reducing plug electrode 38 to that portion in concavity 37 as well as an expanded portion 38A outside of concavity 37 forming a redundant interconnect layer on film 361. The patterning of both tungsten film 380 and aluminum layer 361 forms resultant interconnect layer 36.

In this embodiment as well as the first embodiment, a process of forming interconnect layer 36 comprising aluminum is initially performed recognizing that it will be formed with poor penetration leaving a void or defective portion in the form of concavity 37, which concavity can be restored employing a tungsten film which exhibits excellent penetration quality filling in a complete manner concavity 37. As a result, the defective portion of interconnect layer 36 in semiconductor device 31 can be repaired or restored resulting in higher yield of fabricated integrated circuits employing semiconductor devices 31.

Embodiment 3

Reference is now made to FIGS. 8A-8D illustrating a third embodiment of this invention. Semiconductor device 41, shown in FIG. 8D, is substantially similar to the first embodiment shown in FIG. 1 so that a detailed explanation of the same components as shown in FIG. 1 is not necessary.

As shown in FIG. 8D, diffusion layer 43 in substrate 42 may have a depth of about 0.1 μm and comprises a connecting region formed on the surface of substrate 42 for connection with interconnect layer 46 of semiconductor device 41. Interlayer insulating film 44 comprises silicon oxide having a thickness of about 1.0 μm and is formed on the surface of diffusion layer 43. Contact hole 45 is formed in interlayer insulating film 44 in corresponding alignment with diffusion layer 43 and may have a diameter of about 1.0 μm corresponding to the same diameter as the region forming diffusion layer 43. Interconnect layer 46 comprising aluminum having a thickness of about 1.0 μis formed on the surface of interlayer insulating film 44, but due to the properties of aluminum, interconnect layer 44 does not completely fill within contact hole 45 forming concavity 47 which extends from the bottom of contact hole 45 to the surface of interconnect layer 46. Concavity 47 is then filled with a tungsten plug electrode 48 so that interconnect layer 46 is connected to diffusion layer 43 via plug electrode 48. Lastly, the surface of semiconductor device 41 is made uniformly flat leaving an interconnect comprising the combination of interconnect layer 46 and plug electrode 48.

Relative to the foregoing structure, interconnect layer 46 is connected to diffusion layer 43 comprises of a tungsten film 48 formed within concavity 47. The tungsten film has an excellent penetration quality so that there is no remaining void formed within concavity 47. In addition, plug electrode 48 buried within concavity 47 so that it is connected to interconnect layer 36 through its surface contact with that layer. As previously indicated relative to the two previous embodiments, even if the size of the contact hole 45 is reduced, good contact area is achieved between plug electrode 48 and interconnect layer 46 providing for a decrease in contact resistance between these two films. In other words, when the radius of concavity 47 is r and the thickness of interconnect layer 46 is t, the contact area between the two films is represented by $\pi r^2$ relative to the structure of plug electrode 48 formed within contact hole 45 and connected to interconnect layer 46 exclusively through its own upper surface. Such a structure is shown in a conventional semiconductor device according to the FIG. 14B. On the other hand, the contact area, represented by $2\pi rt$, for the structure shown in FIG. 8D is the case wherein plug electrode 48 is connected directly to interconnect layer 46 through its own side surface 47. As a result, the range required to satisfy the condition for the structure of this embodiment resulting in a larger contact area compared to that shown in FIG. 14B is formulated relative to the relationship, $2\pi rt > \pi r^2$, i.e., $2t > r$. When the inner width of contact hole 45 is decreased and, further, when the diameter 2r of contact hole 45 is less than 4 times the thickness of interconnect layer 46, the interconnect structure of this invention allows for a greater contact are between plug electrode 48 and interlayer 46 compared to that attainable in FIG. 14B.

Reference is now made to the manufacturing method relative to forming semiconductor device 41 with plug electrode 48 within reference to FIGS 8A-8C.

First, as shown in FIG. 8A, an interconnecting region in the form of a diffusion layer 43 is formed on substrate 42 having a depth of about 0.1 μm. Next, interlayer insulating film 44, comprising a silicon oxide film having thickness in the range of about 1.0 μm is formed on the surface of substrate 42. Then, contact hole 45 is formed in interlayer insulating film 44 in order to expose the surface of diffusion layer 43. The diameter of contact hole 45 may be about 1.0 μm and correspond in diameter to the region of diffusion layer 43.

As illustrated in FIG. 8B, aluminum layer 461, having a thickness of about 1.0 μm, is deposited on the surface side of substrate 42 and insulating layer 44. Aluminum layer 461 will not uniformly and completely fill contact hole 45 resulting in the formation of concavity 47 in layer 461 which extends from the bottom of contact hole 45 to the surface region of aluminum layer 461.

Next, as shown in FIG. 8C, a thick tungsten conductive film 480 is formed by employ selective CVD filling the content of concavity 47. Film 480 not only fills the confines of concavity 47 but is also formed on the surface of aluminum layer 461.

Lastly, as shown in FIG. 8D, the surface of tungsten film 480 is etch backed leaving only the top exposed surface of plug electrode 48 within concavity 47. As a result, interconnect layer 46 is formed by the pattern produced by the etchback of film 480 to the original pattern of aluminum layer 461.

In this embodiment as well as previously described embodiments, a process of forming interconnect layer 46 comprising aluminum is initially performed recognizing that it will be formed with poor penetration leaving a void or defective portion in the form of concavity 47, which concavity can be restored employing a tungsten film which exhibits excellent penetration quality filling in a complete manner concavity 47. As a result, the defective portion of interconnect layer 46 in semiconductor device 41 can be repaired or restored resulting in higher yield of fabricated integrated circuits employing semiconductor devices 41.

Embodiment 4

Reference is now made to FIG. 9 illustrating a fourth embodiment of this invention. In semiconductor device 51 of this embodiment, a n-type diffusion layer 53 is a connecting region having a depth of about 0.1 μm in substrate 52 comprising p-type silicon. Interlayer insulating film 54 may comprise a silicon oxide film having thickness in the range of 0.3 μm to 0.5 μm and is formed on the surface of diffusion layer 53 and substrate 52, after which contact hole 55 having a diameter of about 0.5 μm is formed in interlayer insulating film 54 in correspondence with the region of formed diffusion layer 53. Next, aluminum interconnect layer is formed on interlayer insulating layer 56 having a thickness of about 0.5 μm. However, the aluminum does not penetrate into contact hole 55 resulting in the formation of concavity 57 extending from the bottom of contact hole 55 to the surface of interconnect layer 56. As a result, interconnect layer 56 is not formed within concavity 57 due to the small size of the via or contact hole 55. This concavity 57 is then filled with a plug electrode 58 comprising tungsten film 581, which extends above and over the surface of film 56. Therefore, interconnect layer 56 is connected to diffusion layer 53 through plug electrode 58 formed within contact hole 55. Lastly, the surface of semiconductor device 51, comprising plug electrode 58 and interconnect layer 56, is planarized.

Plug electrode 58 may alternatively be a titanium nitride film or a polysilicon film rather than a tungsten film. Further, another approach for filling concavity 57 comprises forming a conductive layer, such as, a nickel plating film or other deposited metal film and having a thickness of about 1.0 um. Also, an etchback may be performed etching film 581 back to the surface of layer 56 leaving only plug electrode 58 within concavity 57. Such a conductive layer has a thickness greater than twice the depth of the contact hole 55.

Relative to the foregoing structure, interconnect layer 56 is connected to diffusion layer 53 through the side surface of plug electrode 58 buried within concavity 58. Therefore, even if the width of contact hole 55, in particular, the width of concavity 57 is small or reduced in size, an extensive contact area is achieved between plug electrode 58 and interconnect layer 56 due to this side face connection. In other words, as indicated in previously described Embodiment 3, where the radius of contact hole 55 is r and the thickness of interconnect layer 56 is t, the contact area is represented by $\pi r^2$, relative to the structure wherein the plug electrode formed within the contact hole is connected to the interconnect layer through only its own upper side surface, as indicated at surface 98 in the semiconductor device shown FIG. 14B. On the other hand, in this embodiment, the contact area is represented by $2\pi rt$ wherein plug electrode 58 is connected to interconnect layer 56 through its own side surface or face 59. As a result, the range required to satisfy the condition for the structure of this embodiment resulting in a larger contact area compared to that shown in FIG. 14B is formulated relative to the relationship, $2\pi rt > \pi r^2$, i.e., $2t > r$, i.e., the inner width of contact hole 55 is reduced to a width that is less than 4 times the thickness of interconnect layer 56. The structure of this embodiment achieves a larger contact area between plug electrode 58 and interconnect layer 56 than capable from the conventional approach of FIG. 14. Therefore, in semiconductor device 51 of this embodiment, even if the wiring pattern of the interconnect layer 56 is reduced in size to the submicron regime and the size of contact hole 55 in correspondingly reduced, a low resistance connection can still be achieved. Also, concavity 57 within contact hole 55 is completely filled with the tungsten plug electrode 58 which has excellent surface coverage and penetration along the inner surface of concavity 57 leaving no smaller void. Therefore, no discontinuity occurs within contact hole 55 thereby increasing the reliability and yield of semiconductor device 51. Further, the contact resistance relative to diffusion layer 53 and the wiring resistance within contact hole 57 are low. Furthermore, the surface of semiconductor 51 comprising plug electrode 58 and interconnect layer 56 may be planarized so that when forming a multilayer interconnect structure, a high degree in layout freedom of the integrated circuit wiring structure can be achieved with high density.

Further, as illustrated in connection with subassembly 51A in FIG. 10, interlayer insulating film 54 and interconnect layer 56 are formed on the surface of substrate 52 forming a structure that may be employed as a gate array or ROM subassembly. In this embodiment, according to desired customization, a concavity 57 may be formed relative to the surface of interconnect layer 56 wherein a predetermined pattern of concavities are produced. The depth of the concavities is to the surface insulating layer 54. After this the formation of the concavities, each concavity 57 is filled with a plug electrode 58 so that diffusion layer 53 in substrate 52 is electrically connected to interconnect layer 56 via insulating layer 54 through the side surface of plug electrode 58 and the congruent side surface of interconnect layer 56. The resulting subassembly 51A may function as a gate array or a ROM for recording information over a short term.

Semiconductor device 51 may be fabricated as follows. First, as shown in FIG. 11A, an interconnecting region in the form of a diffusion layer 53 is formed on substrate 52 having a depth of about 0.1 μm. Next, interlayer insulating film 54, comprising a silicon oxide film having thickness in the range of 0.3 μm~0.5 μm is formed on the surface of substrate 42. Further, aluminum layer 561 having a thickness of about 0.5 μm, to be formed as interconnect layer 56, is deposited on the surface of interlayer insulating film 54. The semiconductor structure as formed to this stage may be employed as a subassembly in the manufacture of a gate array or ROM. In this connection, a mask layer having a predetermined mask pattern is formed on the surface of interconnect layer 56, interconnect layer 56 and interlayer insulating film 54 are selectively etched forming a series of concavities 57 comprising contact holes 55.

After removing the mask layer, a tungsten film 581 is, then, formed outside of concavity 57, i.e., on the surface side of aluminum layer 561 as well as within concavity 57, as shown in FIG. 11B.

After the foregoing process, an etchback is performed on the surface of tungsten film 581 leaving only that portion of tungsten film 581 remaining in concavity 57, comprising plug electrode 58, as previously illustrated in FIG. 9.

In this embodiment, interconnect layer 56 is formed upon performing a pattern of contact holes 55 in the already deposited aluminum layer 561. Alternate processes may be employed in forming plug electrode 58. For example, a conductive film comprising a plated nickel layer or other such deposited metal film having high penetration qualities and having a thickness of about 1.0 μm may be formed, followed by the etching away portions of the film outside of the formed contact hole 55. As in the case of previous embodiments, a titanium nitride film or a polysilicon film may be employed in lieu of a tungsten film to fill the interior of concavities 57 since these films also have good penetration quality. Lastly, a thin nickel layer may be formed on the bottom surface of contact hole 55 by means of plating and plug electrode 58 is thereafter formed selectivity within concavity 57 by means of pewter plating with pewter having a melting point in the range of 400° C.-600° C.

In this embodiment as well as previously described embodiments, a process of forming layer 561 comprising aluminum is initially performed recognizing that it will be formed with poor penetration leaving a void or defective portion in the form of a concavity 57 if a contact hole is formed beforehand, by selective etching contact holes 55 after the formation of layer 561 and thereafter depositing a tungsten film, which exhibits excellent penetration quality, filling in contact holes 55, concavities 57 in contact holes 55 can be eliminated altogether. As a result, the formation of a defective portion in an initially formed interconnect layer 56 on contact holes can be eliminated all together, resulting in higher yield of fabricated integrated circuits employing semiconductor devices 51.

Embodiment 5

Reference is now made to FIG. 12 illustrating a fifth embodiment of this invention. Semiconductor device 71 is substantially similar to the fourth embodiment shown in FIG. 9 so that a detailed explanation of the same components as shown in FIG. 9 is not necessary.

A n-type diffusion layer 73 is a connecting region having a depth of about 0.1 μm in substrate 72 comprising p-type silicon. Interlayer insulating film 74 may comprise a silicon oxide film having thickness of about 1 μm and is formed on the surface of diffusion layer 73 and substrate 72, after which contact hole 75 having a diameter of about 1.0 μm is formed in interlayer insulating film 74 in correspondence with the region of formed diffusion layer 73. Also, contact hole 75 is self-aligned by employing the expanded portion which is formed in an interconnect layer 76 by photo etching method. Next, aluminum interconnect layer is formed on interlayer insulating layer 76 having a thickness of about 1.0 μm. However, the aluminum does not penetrate into contact hole 75 resulting in the formation of concavity 77 extending from the bottom of contact hole 75 to the surface of interconnect layer 76. As a result, interconnect layer 76 is not completely formed within concavity 77 due to the small size of via or contact hole 75. This remaining concavity 57 is then filled with a plug electrode comprising tungsten film 78. Therefore, interconnect layer 76 is connected to diffusion layer 73 through plug electrode 78 formed within contact hole 75. Lastly, the surface of semiconductor device 71, comprising plug electrode 78 and interconnect layer 76, is planarized.

In semiconductor device 71, as well as semiconductor device 51 according to embodiment 4, interconnect layer 76 is connected to diffusion layer 73 through the side face of plug electrode 78 which is buried within concavity 77. Therefore, even if the width of contact hole 75, in particular, the width of concavity 77 is small or reduced in size, an extensive contact area is achieved between plug electrode 78 and interconnect layer 76 due to this side face connection thereby achieving low contact resistance. Further, since concavity 77 within contact hole 75 is entirely filled with a tungsten plug electrode 78 providing for excellent coverage, the contact resistance relative to diffusion layer 73 and wiring resistance within contact hole 77 are low. In addition, since there is no remaining discontinuity in contact hole 75, the functional and operational reliability of device 71 is greatly enhanced since there is no possible disconnection in or high resistance formed within contact hole 75. Further, the surface of semiconductor 71 comprising plug electrode 78 and interconnect layer 76 may be planarized, therefore, reliability is not deteriorated wherein multilayer interconnect structures are employed over tungsten filled contact hole 75. Therefore, a high degree of freedom is achieved in multilayer circuit layout providing for high density integrated circuits. In addition, interlayer insulating film 74 and interconnect layer 76 are formed beforehand on the surface side of substrate 72 and thereafter concavities 77 may be selectively formed on the surface of metal interconnect layer 76 in a predetermined pattern and with concavities 77 thereafter filled with tungsten plug electrodes 78 forming a structure that functions as a gate array or ROM.

The semiconductor device 71 having such structures is able to be manufactured, for example, by the following manufacturing method.

Semiconductor device 71 may be fabricated as follows. First, as shown in FIG. 13A, an interconnecting region in the form of a diffusion layer 73 is formed on substrate 72 having a depth of about 0.1 μm. Next, interlayer insulating film 74, comprising a silicon oxide film having thickness in the range of 1.0 μm is formed on the surface of substrate 72. Further, aluminum layer 761 having a thickness of about 1.0 μm, to be formed as interconnect layer 76, is deposited on the surface of interlayer insulating film 74.

Next, a mask layer having a predetermined mask pattern employing a photoresist is formed on the surface of interconnect layer 76, as shown in FIG. 13B, the exposed portion 761A of the pattern is formed in aluminum layer 761 by photo etching.

After the mask layer is removed, the resulting structure is shown in FIG. 13B, interlayer insulating film 74 is etched through portions 671A employing aluminum layer 761 as a mask layer during the etching step. The resulting contact hole 75 is self aligned to portion 74A, as shown in FIG. 13C, forming concavity 77 extending from the bottom of contact hole 75 at diffusion layer 73 to the top surface of aluminum layer 761. Next, as shown in FIG. 13D, tungsten film 781 is formed within concavity and on the surface of the aluminum layer 761. This is followed by an etchback of film 781 to the surface film 761 and plug electrode 78, as shown in FIG. 12 so that the tungsten film only exists within concavity 77. Plug electrode 58 may be formed of plated nickel layer or other deposited metal film of high penetration quality with any portion formed outside of concavity 77 being etched away. Such a conductive layer has a thickness comparable with the depth of concavity 77. Plug electrode 78 may alternatively be a titanium nitride film or a polysilicon film rather than a tungsten film. Lastly, a thin nickel layer may be formed on the bottom surface of contact hole 75 by means of plating and plug electrode 78 is thereafter formed selectively within concavity 77 by means of pewter plating with pewter having a melting point in the range of 400° C.-600° C.

In summary, the present invention provides a feature in connection with the semiconductor device wherein an interconnect layer is connected to the connecting region formed in the surface of a substrate through a contact hole or via formed in an interlayer insulating film formed on the surface of the substrate leaving a concavity extends from the bottom of a contact hole to the surface of an interconnect layer when the interconnect layer is formed, the concavity is filled with a conductive plug electrode having a high penetration coefficient. Therefore, even in the case wherein the integrated circuit pattern formed relative to the interconnect layer is reduced to or extended within the submicron range, rendering the size of the contact hole correspondingly smaller, the interconnect layer is connected with a high degree of certainty to the connecting region. Since the concavity formed in the contact hole or via is positively filled with the plug electrode material having a high penetration quality, the overlying interconnect layer is electrically connected through a comparatively large contact area through the side face or surface of the interconnect layer resulting in improved electrical characteristics and reliability of the formed semiconductor device. Such a formed concavity represents a defective portion of the interconnect layer formed within the contact hole resulting in deteriorated wiring resistance and contact resistance with the contact region due to the defective portion.

Also, when the plug electrode within the concavity of the contact hole is formed to be separated from the connecting region by an interlayer insulating film, the resulting structure can function as an addressed charge storage site wherein a pattern of such sites can be utilized as a memory device for recording information. Such a memory structure is easily and reliably fabricated.

Lastly, in the cases where a formed plug electrode extends from with a contact hole and out onto the surface of an interconnect layer, the extended portion functions as a redundant interconnect layer with the first formed interconnect layer and thereby improves the electrical characteristic and the reliability of the interconnect layer.

While the invention has been described in conjunction with several specific embodiments, it is evident to those skilled in the art that many further alternatives, modifications and variations will be apparent in light of the foregoing description. For example, respect to each of the foregoing embodiments, a designated connecting region which is connected to an interconnect layer may not only comprise a diffusion layer in a substrate, as is the case in each of the embodiments, but also may comprise a lower interconnect layer in a multilayer interconnection structure. Also, plug electrodes may be composed of a plurality or composite of metal materials having high penetration quality rather than purely a single metal material of such quality. Also, when the diffusion layer is the involved connecting region, the diffusion layer may be connected to the interconnect layer via a plug electrode formed on silicide compound which is formed on the diffusion region. Thus, the invention described herein is intended to embrace all such alternatives, modifications, applications and variations as may fall within the spirit and scope of the appended claims.

What is claimed is:

1. A semiconductor device comprising:
a conductive interconnect layer connected to a connecting region formed in a surface of a substrate through a contact hole in an interlayer insulating film formed on said substrate.
said interconnect layer not filling all of said contact hole leaving therein a void extending substantially from a bottom of said contact hole at said substrate to the upper surface of said interconnect layer,
said void thereafter filed with a conductive plug electrode,
said plug electrode penetrating to the bottom of said void in contact with said connecting region,
principal contact between said interconnect layer and said connecting region accomplished by side surface engagement between said interconnect layer and said plug electrode and by bottom surface engagement between said connection region and said plug electrode,
wherein the diameter of said contact hole is about equal to or less than four times a thickness of said interconnect layer.

2. A semiconductor device comprising:
a conductive interconnect layer connected to a connecting region formed in a surface of a substrate through a contact hole in an interlayer insulating film formed on said substrate,
said interconnect layer not filling all of said contact hole leaving therein a void extending substantially from a bottom of said contact hole at said substrate to the upper surface of said interconnect layer,
said void thereafter filed with a conductive plug electrode,
said plug electrode penetrating to the bottom of said void in contact with said connecting region,
principal contact between said interconnect layer and said connecting region accomplished by side surface engagement between said interconnect layer and said plug electrode and by bottom surface engagement between said connection region and said plug electrode,
a portion of said plug electrode extending from within said void onto and over the surface of said interconnect layer,
said extended portion of said plug electrode comprising a redundant interconnect layer in combination with said interconnect layer layer in combination with said interconnect layer.

3. A semiconductor device comprising:

a conductive interconnect layer connected to a connecting region formed in a surface of a substrate through a contact hole in an interlayer insulating film formed on said substrate, said interconnect layer not filling all of said contact hole leaving therein a void extending substantially from a bottom of said contact hole at said substrate to the upper surface of said interconnect layer, said void thereafter filed with a conductive plug electrode, said plug electrode penetrating to the bottom of said void in contact with said connecting region, principal contact between said interconnect layer and said connecting region accomplished by side surface engagement between said interconnect layer and said plug electrode and by bottom surface engagement between said connection region and said plug electrode, said plug electrode is comprised of either metal or metal alloy having a lower melting point below a melting point of a metal or metal alloy comprising said conductive interconnect layer.

4. The semiconductor device of claim 2 wherein said plug electrode comprises tungsten, titanium nitride, doped polysilicon, or a nickel film with either tin or pewter, and said interconnect layer comprises aluminum.

5. The semiconductor device of claim 3 wherein said plug electrode comprises a plated nickel film with either tin or pewter.

6. The semiconductor device as defined in any one of the claims 2 and 3 wherein said void is produced after formation of said contact hole with formation of said interconnect layer, said principal contact comprises said plug electrode and said interconnect layer within said contact hole.

7. The semiconductor device as defined in any one of the claims 2 and 3 wherein said void is produced by formation of said contact hole after formation of said interconnect layer on said interlayer insulating film, said principal contact comprises said interconnect layer connected to said connecting region through the formation of said plug electrode within said contact hole.

8. The semiconductor device as defined in any one of the claims 2 and 3 wherein the diameter of said contact hole is about equal to or less than four times a thickness of said interconnect layer.

* * * * *

UNITED STATES PATENT AND TRADEMARK OFFICE
CERTIFICATE OF CORRECTION

PATENT NO. : 5,327,011
DATED : July 5, 1994
INVENTOR(S): Seiichi Iwamatsu

It is certified that error appears in the above-identified patent and that said Letters Patent is hereby corrected as shown below:

Claim 1

Column 16, line 24, change the period (.) to a comma (,).

Claim 2

Column 16, line 66, delete "layer", second occurrence.

Signed and Sealed this

Third Day of January, 1995

*Attest:*

BRUCE LEHMAN

*Attesting Officer*   *Commissioner of Patents and Trademarks*